(12) United States Patent
Deng (10) Patent No.: US 12,199,155 B2
(45) Date of Patent: Jan. 14, 2025

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Wufeng Deng, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 381 days.

(21) Appl. No.: 17/582,788

(22) Filed: Jan. 24, 2022

(65) Prior Publication Data

US 2022/0238668 A1    Jul. 28, 2022

(30) Foreign Application Priority Data

Jan. 25, 2021 (CN) .......................... 202110099858.8

(51) Int. Cl.
*H01L 29/417*    (2006.01)
*H01L 21/768*    (2006.01)
*H01L 29/40*     (2006.01)

(52) U.S. Cl.
CPC .... *H01L 29/41775* (2013.01); *H01L 21/7682* (2013.01); *H01L 29/401* (2013.01); *H01L 21/76897* (2013.01)

(58) Field of Classification Search
CPC ............. H01L 29/41775; H01L 29/401; H01L 29/6653; H01L 29/0649–0653; H01L 29/4991; H01L 29/515; H01L 21/7682; H01L 21/76897; H01L 2221/1042–1047
See application file for complete search history.

(56) References Cited

U.S. PATENT DOCUMENTS

2018/0166553 A1* 6/2018 Lee ................. H01L 21/311
2020/0295014 A1* 9/2020 Yu .................. H01L 29/66636

* cited by examiner

*Primary Examiner* — Jesse Y Miyoshi
*Assistant Examiner* — Andrew Chung
(74) *Attorney, Agent, or Firm* — Anova Law Group, PLLC (57) ABSTRACT

A semiconductor structure and a fabrication method are provided. The semiconductor structure includes: a base substrate; gate structures and source/drain plugs over the base substrate; source/drain contact structures on the source/drain plugs; gate contact structures on the gate structures; and a dielectric layer on the gate structures and the source/drain plugs. Cavities are formed between the gate structures and the source/drain plugs along a surface of the base substrate. The dielectric layer encloses tops of the cavities.

16 Claims, 8 Drawing Sheets

SEMICONDUCTOR STRUCTURE AND FABRICATION METHOD THEREOF

CROSS-REFERENCE TO RELATED APPLICATION

This application claims the priority of Chinese Patent Application No. 202110099858.8, filed on Jan. 25, 2021, the content of which is incorporated herein by reference in its entirety.

TECHNICAL FIELD

The present disclosure generally relates to the field of semiconductor fabrication technology and, more particularly, relates to a semiconductor structure and its fabrication method.

BACKGROUND

With the continuous development of semiconductor technologies, improvement of the performance of an integrated circuit is mainly achieved by continuously reducing the size of the integrated circuit device to increase its speed. Because of demand for a high device density, high performance, and low cost, the semiconductor industry has advanced to a nanotechnology process node, and the preparation of semiconductor devices is restricted by various physical limits.

As the size of CMOS devices continues to shrink, challenges from manufacturing and design have prompted development of three-dimensional designs such as fin field effect transistors (FinFETs). Compared with existing planar transistors, a FinFET is an advanced semiconductor device used at 20 nm and below process nodes. It can effectively control the insurmountable short-channel effect caused by the scaling down of the device, and it can also effectively improve a density of an array of transistors formed on the substrate. Further, a gate in the FinFET is arranged around a fin (a fin-shaped channel), such static electricity can be controlled from three sides and the performance in terms of static electricity control is also more prominent.

However, the performance of fin field effect transistors formed by existing technologies needs to be improved.

SUMMARY

One aspect of the present disclosure provides a semiconductor structure. The semiconductor structure includes: a base substrate; gate structures and source/drain plugs on the base substrate; gate contact structures on the gate structures; source/drain contact structures on the source/drain plugs; and a dielectric layer on the gate structures and the source/drain plugs. Cavities are formed between the gate structures and the source/drain plugs along a surface of the base substrate. The dielectric layer encloses tops of the cavities.

Another aspect of the present disclosure provides a fabrication method for forming a semiconductor structure. The method includes: providing a base substrate; forming gate structures and source/drain plugs on the base substrate, where sacrificial spacers are provided between the gate structures and the source/drain plugs; forming source/drain contact structures on the source/drain plugs; forming gate contact structures on the gate structures; after forming the source/drain contact structures and the gate contact structures, removing the sacrificial spacers to form cavities between the gate structures and the source/drain plugs; and forming a dielectric layer on the gate structures and the source/drain plugs, where the dielectric layer encloses tops of the cavities.

Optionally, the gate structures, the source/drain plugs, and the sacrificial spacers are formed by: forming the gate structures and a sacrificial material film on the base substrate, where the sacrificial material film covers side surfaces of the gate structures; and forming the source/drain plugs in the sacrificial material film, where a portion of the sacrificial material film between the gate structures and the source/drain plugs forms the sacrificial spacers.

Optionally, the gate structures and the sacrificial material film are formed by: forming dummy gate structures on the base substrate; forming the sacrificial material film on the base substrate, where the sacrificial material film covers side surfaces of the dummy gate structures; removing the dummy gate structures to form dummy gate openings in the sacrificial material film; and forming the gate structures in the dummy gate openings.

Optionally, after forming the dummy gate structures and before forming the sacrificial material film, the method further includes: forming spacers at side surfaces of the dummy gate structures. The sacrificial material film covers side surfaces of the spacers.

Optionally, after forming the spacers and before forming the sacrificial material film, the method further includes: forming source/drain doped regions in the base substrate at two sides of each dummy gate structure and a corresponding spacer. The source/drain plugs are formed after forming the source/drain doped regions, and a bottom of each source/drain plug is in contact with a surface of a corresponding source/drain doped region.

Optionally, top surfaces of the source/drain plugs are higher than top surfaces of the gate structures.

Optionally, after forming the gate structures and the sacrificial material film, and before forming the source/drain plugs, the method further includes: forming a first sacrificial layer on the surface of the sacrificial material film and the surfaces of the gate structures. The source/drain plugs are formed in the sacrificial material film and the first sacrificial layer.

Optionally, the source/drain plugs are formed by: forming plug openings in the sacrificial material film and the first sacrificial layer to expose the surfaces of the source/drain doped regions; forming a source/drain plug material film in the plug openings and on a surface of the first sacrificial layer; and planarizing the source/drain plug material film until exposing the surface of the first sacrificial layer, to form the source/drain plugs in the plug openings.

Optionally, after forming the plug openings and before forming the source/drain plug material film, the method further includes: forming a first protection layer on side surfaces of each of the plug openings. The first protection layer and the sacrificial spacers are made of different materials.

Optionally, the source/drain plug material film is formed by: forming a plug barrier material film on bottoms and side surfaces of the plug openings and on the surface of the first sacrificial layer; and forming a plug conduction material film on a surface of the plug barrier material film. The plug conduction material film fills up the plug openings.

Optionally, after forming the source/drain plugs and before forming the source/drain contact structures, the method further includes: etching a portion of the source/drain plugs, to form barrier openings in the first sacrificial layer; and forming a barrier layer in each barrier opening. The barrier layer is located at a top surface of a corresponding etched source/drain plug, and has a width larger than a width of the corresponding etched source/drain plug. The source/drain contact structures are formed after forming the barrier layer, and located at the top surfaces of the etched source/drain plugs and penetrate through barrier layers.

Optionally, the barrier openings are formed by: forming a mask layer on the surfaces of the source/drain plugs and the surface of the first sacrificial layer, exposing the top surfaces of the source/drain plugs and the surface of a portion of the first sacrificial layer at two sides of each source/drain plugs; and using the mask layer as a mask to etch a portion of the source/drain plugs and the first sacrificial layer, to form the barrier openings in the first sacrificial layer. The barrier openings expose the top surfaces of the etched source/drain plugs.

Optionally, the barrier layers in the barrier openings are formed by: forming a barrier material layer in the barrier openings and on the surface of the first sacrificial layer; and planarizing the barrier material layer to expose the surface of the first sacrificial layer, to form one barrier layer in each barrier opening.

Optionally, after forming the gate structures and the source/drain plugs, and before forming the gate contact structures and the source/drain contact structures, the method further includes: forming a second sacrificial layer on the surfaces of the source/drain plugs and the surface of the first sacrificial layer. The gate contact structures and the source/drain contact structures are formed in the first sacrificial layer and the second sacrificial layer.

Optionally, the gate contact structures are formed by: forming gate contact openings in the first sacrificial layer and the second sacrificial layer, to expose the top surfaces of the gate structures; forming a gate contact material film in the gate contact openings and on a surface of the second sacrificial layer; and planarizing the gate contact material film may until exposing the surface of the second sacrificial layer, to form a gate contact structure in each gate contact opening.

Optionally, after forming the gate contact openings and before forming the gate contact material film, the method further includes: forming a third protection layer on side surfaces of each gate contact opening. The second protection layer and the sacrificial spacers are made of different materials Optionally, the gate contact material film is formed by: forming a gate barrier material film on bottoms and side surfaces of the gate contact openings and on the surface of the second sacrificial layer; and forming a gate conducting material film on a surface of the gate barrier material film. The gate conducting material film fills up the gate contact openings.

Optionally, the source/drain contact structures are formed by: forming source/drain contact openings in the first sacrificial layer and the second sacrificial layer, to expose the top surfaces of the source/drain doped regions; forming a source/drain contact material film in the source/drain contact openings and on a surface of the second sacrificial layer; and planarizing the source/drain contact material film may until exposing the surface of the second sacrificial layer, to form a source/drain contact structure in each source/drain contact opening.

Optionally, after forming the source/drain contact openings and before forming the source/drain contact material film, the method further includes: forming a third protection layer on side surfaces of each source/drain contact opening. The third protection layer and the sacrificial spacers are made of different materials.

Optionally, the source/drain contact material film is formed by: forming a source/drain barrier material film on bottoms and side surfaces of the source/drain contact openings and on the surface of the second sacrificial layer; and forming a source/drain conducting material film on a surface of the source/drain barrier material film. The source/drain conducting material film fills up the source/drain contact openings.

Optionally, the dielectric layer is formed by: forming a bottom dielectric layer on the tops of the gate structures, a portion of the side surfaces of the source/drain plugs, top surfaces and side surfaces of the gate contact structures, and top surfaces and side surfaces of the source/drain contact structures, where the bottom dielectric layer encloses the tops of the cavities; and forming an upper dielectric layer on a surface of the bottom dielectric layer.

Optionally, the bottom dielectric layer is formed by a chemical vapor deposition process including an ion-enhanced chemical vapor deposition process or a high-concentration plasma deposition process.

Optionally, when removing the sacrificial spacers, the first sacrificial layer and the second sacrificial layer are removed to form dielectric openings between the adjacent source/drain contact structures and the gate contact structures, and between a portion of the source/drain plugs and the gate contact structures. Bottoms of the dielectric openings expose the top surfaces of the cavities and the top surfaces of the gate structures.

Optionally, the base substrate includes a substrate, fins on the substrate, and an isolation layer. The isolation layer covers a portion of side surfaces of the fins. The gate structures are located on a surface of the isolation layer and cross the fins. The gate structures are located at a portion of top surfaces and side surfaces of the fins.

In the semiconductor structure provided by various embodiments of the present disclosure, the cavities may be formed between the source/drain plugs and the gate structures. The cavities may have an opening structure and air may fill up the cavities. Correspondingly, the cavities may have a relatively small dielectric constant. The parasitic capacitance between the gate structures and the source/drain plugs may be reduced, to improve the performance of the semiconductor structure.

In the fabrication method of the semiconductor structure provided by various embodiments of the present disclosure, the gate structures and the source/drain plugs may be formed on the base substrate and the sacrificial spacers may be provided between the gate structures and the source/drain plugs. After forming the gate contact structures and the source/drain contact structures, the sacrificial spacers may be removed to form the cavities between the gate structures and the source/drain plugs. The cavities may have an opening structure and air may fill up the cavities. Correspondingly, the cavities may have a relatively small dielectric constant. The parasitic capacitance between the gate structures and the source/drain plugs may be reduced, to improve the performance of the semiconductor structure.

Further, by providing the spacers on the side surfaces of the gate structures, the spacers may protect the gate structures to reduce the damage on the side surfaces of the gate structures in subsequent processes. The performance of the gate structures may be improved.

Further, after forming the source/drain plugs, a portion of the source/drain plugs may be etched, to form the barrier openings in the first sacrificial layer; and then one barrier layer may be formed in each barrier opening. Each barrier layer may be located on a top surface of a corresponding source/drain plug after etching, and a width of the barrier layer may be larger than a width of the corresponding source/drain plug. The barrier layers may prevent the gate structures from being damaged when forming the source/drain contact openings by self alignment subsequently. Further, the barrier layers with a relatively larger width may have a certain blocking and buffering effect on deposited materials. Correspondingly, the deposited materials may not easily enter cavities when forming the dielectric layer by a deposition process subsequently, which may be beneficial for the dielectric layer to make the top of the cavity enclosed, thereby improving the performance of the formed semiconductor structure.

Further, before removing the sacrificial spacers, the first sacrificial layer and the second sacrificial layer may be formed. After forming the first sacrificial layer and the second sacrificial layer, the gate contact structures and the source/drain contact structures may be formed. Subsequently, when removing the sacrificial spacers, the first sacrificial layer and the second sacrificial layer may be also removed. The cavities may be formed between the gate structures and the source/drain plugs, and also between a portion of the gate contact structures and the source/drain plugs. The gate contact structures may be located at the top surfaces of the gate structures. Each of the cavities may occupy a large volume. Correspondingly, the parasitic capacitance between the gate structures and the source/drain plugs, and between the portion of the gate contact structures and the source/drain plugs, may be reduced effectively, to improve the performance of the semiconductor structure.

Further, after forming the plug openings and before forming the source/drain plug material film, a first protection layer may be formed on the side surface of each plug opening. The first protection layer and the sacrificial spacers may be made of different materials. The first protection layers may protect the source/drain plugs. When removing the sacrificial spacers subsequently, the etching damage on the sidewalls of the source/drain plugs may be reduced, to improve the performance of the source/drain plugs.

Further, after forming the gate contact openings and before forming the gate contact material film, a second protection layer may be formed on the side surfaces of each gate contact opening. The second protection layer and the sacrificial spacers may be made of different materials. The gate contact structures formed subsequently may be protected. Correspondingly, when removing the sacrificial barriers subsequently, the etching damage on the side walls of the gate contact structures may be reduced, to improve the performance of the formed gate contact structures.

Further, after forming the source/drain contact openings and before forming the source/drain contact material film, a third protection layer may be formed on the side surfaces of each source/drain contact opening. The third protection layer and the sacrificial spacers may be made of different materials. The source/drain contact structures formed subsequently may be protected. Correspondingly, when removing the sacrificial barriers subsequently, the etching damage on the side walls of the source/drain contact structures may be reduced, to improve the performance of the formed source/drain contact structures.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

It should be noted that "surface" or "upper" in this specification are used to describe the relative positional relationship in space, and are not limited to whether they are in direct contact.

FIGS. 1-4 illustrate semiconductor structures corresponding to certain stages for forming a semiconductor structure.

Figure 1:
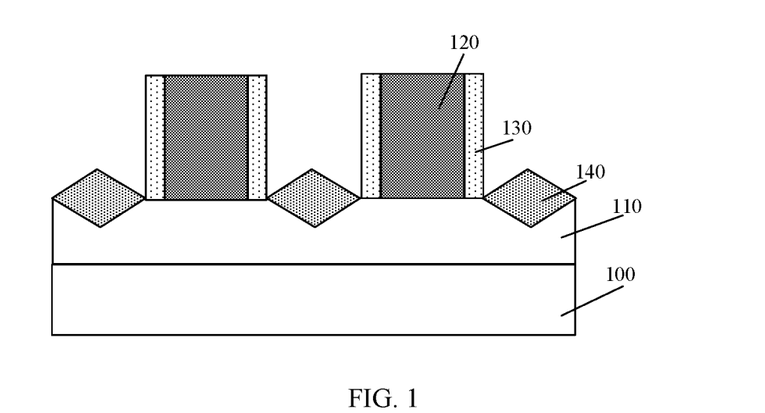
FIGS. 1-4 illustrate semiconductor structures corresponding to certain stages for forming a semiconductor structure.

As shown in FIG. 1, a base substrate 100 is provided. Fins 110 and dummy gate structures 120 are provided on the base substrate. The dummy gate structures 120 cross the fins 110 and are located on a portion of a top surface and side surfaces of the fins 110. Spacers 130 are formed on side surfaces of the dummy gate structure 120. Source/drain doped regions 140 are formed in the fins 110 at two sides of each of the dummy gate structure 120 and a corresponding spacer 130.

Figure 2:
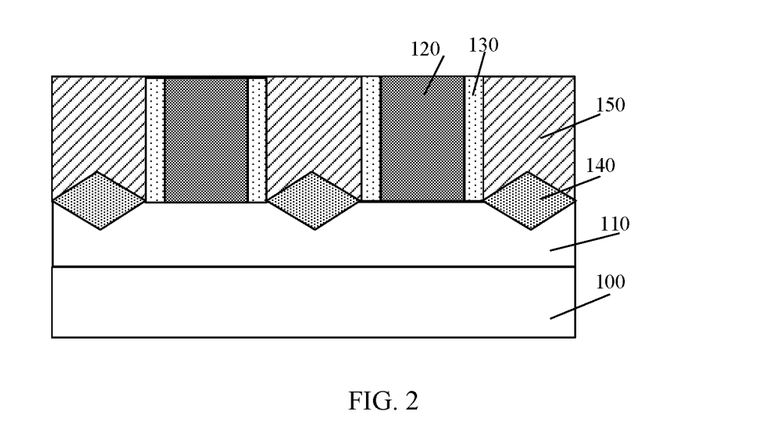

As shown in FIG. 2, a first dielectric layer 150 may be formed on the base substrate 100. The first dielectric layer 150 covers side surfaces of the spacers 130.

Figure 3:
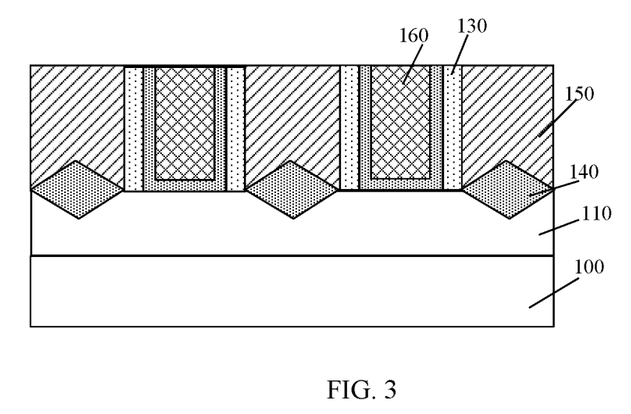

As shown in FIG. 3, the dummy gate structures 120 are removed, to form dummy gate openings (not shown in the figures) in the first dielectric layer 150, and gate structures 160 are formed in the dummy gate openings.

Figure 4:
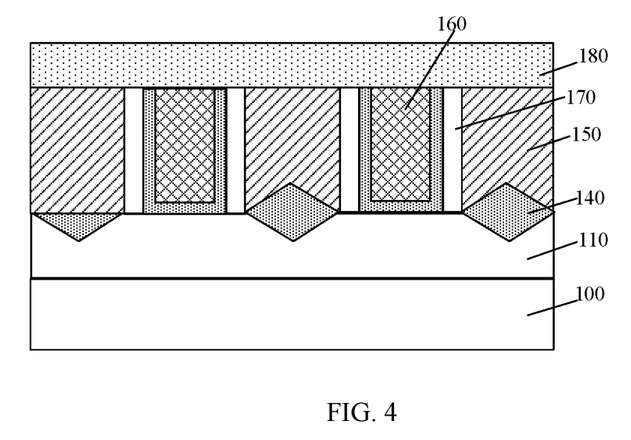

As shown in FIG. 4, after forming the gate structures 160, the spacers 130 are removed to form cavities 170 in the first dielectric layer 150. A second dielectric layer 180 is formed on a surface of the first dielectric layer 150. The second dielectric layer 180 is located on tops of the cavities 170 and seals the tops of the cavities 170.

In the above method, the cavities 170 are formed in the first dielectric layer 150 by removing the spacers 130. Specifically, the cavities 170 are open structures, and are filled with air. In comparison with a material of the spacers 130, the dielectric constant of air is smaller. By forming the cavities 170 at sidewalls of the spacers 130, capacitance between the gate structures 160 and other devices may be reduced, to improve the performance of the formed semiconductor structure.

However, when forming the cavities 170 in the first dielectric layer 150 by removing the spacers 130, the sidewalls of the gate structures 160 are exposed and are prone to be damaged by the etching process. The performance of the gate structures 160 is compromised and the performance of the formed semiconductor structure is still poor.

The present disclosure provides a semiconductor structure and its fabrication method to at least partially alleviate the above problems. In the present disclosure, gate structures and source/drain plugs may be formed on a base substrate, and sacrificial spacers may be provided between the gate structures and the source/drain plugs. Source/drain contact openings may be formed on the source/drain plugs, and gate contact openings may be formed on the gate structures. After forming the source/drain contact openings and the gate structure contact openings the sacrificial spacers may be removed to form cavities between the gate structures and the source/drain plugs. Since the cavities with smaller dielectric constant may be formed between the gate structures and the source/drain plugs, parasitic capacitance between the gate structures and the source/drain plugs may be reduced and the performance of the formed semiconductor structure may be improved.

One embodiment of the present disclosure provides a fabrication method of a semiconductor structure. FIGS. 5-14 illustrate semiconductor structures corresponding to certain stages of forming an exemplary semiconductor structure, and FIG. 15 illustrates an exemplary method for forming a semiconductor structure.

Figure 5:
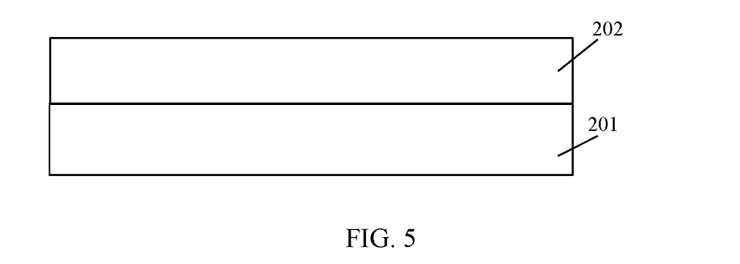
FIGS. 5-14 illustrate semiconductor structures corresponding to certain stages of forming an exemplary semiconductor structure according to various disclosed embodiments of the present disclosure.
Figure 15:
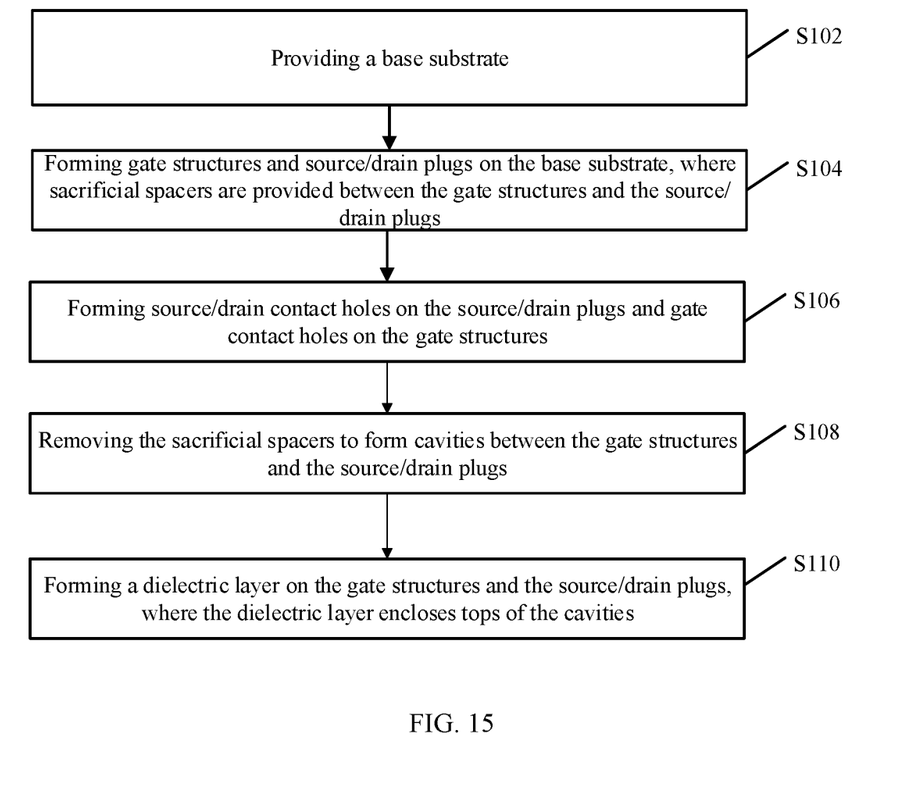
FIG. 15 illustrates an exemplary method for forming a semiconductor structure according to various disclosed embodiments of the present disclosure.

As shown in FIG. 5, a base substrate may be provided (e.g., S102 in FIG. 15).

In one embodiment, the base substrate may include a substrate 201, fins 202 on the substrate 201, and an isolation layer (not shown in the figure). The isolation layer may cover a portion of side surfaces of the fins 202.

In one embodiment, the substrate 201 may be made of silicon. In other embodiments, the substrate 201 may be made of germanium, SiGe, SiC, GaAs, InGa, or a combination thereof.

In one embodiment, the fins 202 may be made of silicon. In other embodiments, the fins 202 may be made of germanium, SiGe, SiC, GaAs, InGa, or a combination thereof.

The isolation layer may electrically isolate adjacent fins 202.

In one embodiment, the isolation layer may be made of $SiO_x$. In other embodiments, the isolation layer may be made of a material including $SiN_x$ or SiNO.

In other embodiments, the base substrate may be a planar substrate.

Figure 6:
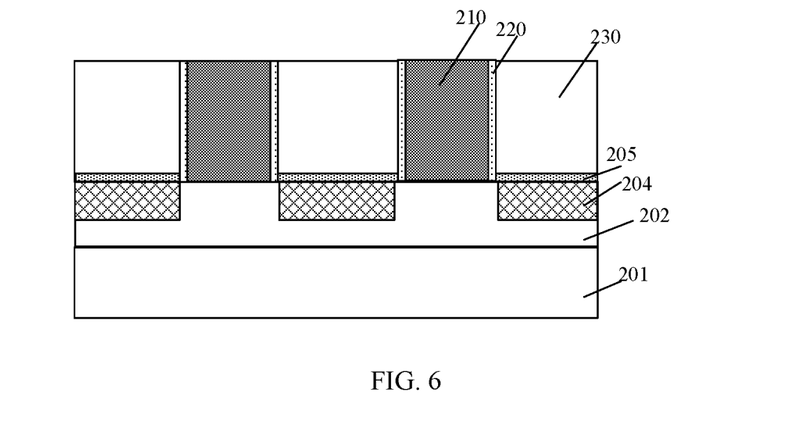
Figure 7:
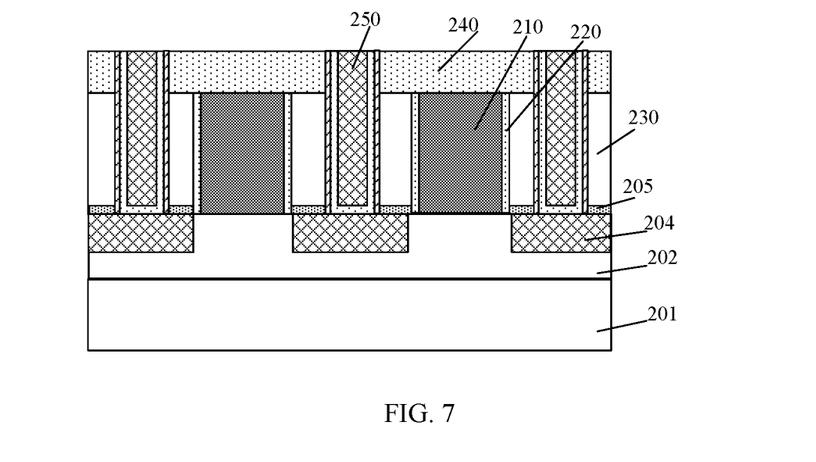

Subsequently, gate structures and source/drain plugs may be formed, and sacrificial spacers may be provided between the gate structures and the source/drain plugs. FIG. 6 and FIG. 7 illustrate the process to form the gate structures, the source/drain plugs, and the sacrificial spacers (e.g., S104 in FIG. 15).

As shown in FIG. 6, gate structures 210 and a sacrificial material film 230 may be formed on the base substrate. The sacrificial material film 230 may cover side surfaces of the gate structures 210.

The sacrificial material film 230 may provide support for the source/drain plugs to be formed, and also may occupy spaces for forming cavities subsequently.

The gate structures 210 may be disposed on a surface of the isolation layer and cross the fins 202. The gate structures 210 may be located at a portion of top surfaces and side surfaces of the fins 202.

The gate structures 201 and the sacrificial material film layer 230 may be formed by: forming dummy gate structures (not shown in the figures) on the base substrate; forming the sacrificial material film to cover side surfaces of the dummy gate structures; removing the dummy gate structures to form dummy gate openings (not shown in the figures) in the sacrificial material film; and forming one gate structure 201 in each of the dummy gate openings.

In one embodiment, after forming the dummy gate structures, the method may further include forming spacers 220 on the side surfaces of the dummy gate structures. The sacrificial material film may cover side surfaces of the spacers 220.

By providing the spacers 220 on the side surfaces of the gate structures 210, the spacers 220 may protect the dummy gate structure to reduce the damage on the side surfaces of the gate structures 210 in subsequent processes. The performance of the gate structures 210 may be improved.

The spacers 220 may be made of a material different from a material of the sacrificial material film 230.

The spacers 220 may be made of $SiO_x$, $SiN_x$, SiNO, $TiO_2$, or a combination thereof.

The sacrificial material film 230 may be made of $SiO_x$, $SiN_x$, SiNO, $TiO_2$, or a combination thereof.

After forming the spacers 220 and before forming the sacrificial material film 230, the method may further include forming source/drain doped regions 204 in the base substrate at two sides of each dummy gate structure and corresponding spacers 220.

The source/drain doped regions 204 may be formed by: removing a portion of the base substrate at two sides of each dummy gate structure and corresponding spacers 220, to form source/drain openings in the base substrate; and forming the source/drain doped regions in the source/drain openings.

The source/drain doped regions may be formed in the source/drain openings by: forming epitaxial layers in the source/drain openings by an epitaxial growth process (not shown in the figures); doping the epitaxial layers with source/drain ions by an in situ doping process when forming the epitaxial layers, to form the source/drain doped regions 204.

In one embodiment, the source/drain doped regions 204 may be located in the fins 202.

In one embodiment, after forming the source/drain doped regions 204 and before forming the sacrificial material film 230, the method may further include forming a stop layer 205 on surfaces of the source/drain doped regions 204.

The stop layer 205 may be used as a stop layer when plug openings of the source/drain plugs formed subsequently by etching.

In one embodiment, the sacrificial material film 230 may be formed by: forming a dielectric material layer (not shown in the figures) on the base substrate 200 to cover the dummy gate structures 210 and the spacers 220, where a whole top surface of the dielectric layer is higher than the top surfaces of the dummy gate structures 210; and removing a portion of the dielectric layer higher than the top surfaces of the dummy gate structures 210 to form the sacrificial material film 230.

As shown in FIG. 7, forming a first sacrificial layer 240 on a surface of the sacrificial material film 230 and the surfaces of the gate structures 210.

The first sacrificial layer 240 and the sacrificial material film 230 may cooperate to provide support for subsequently forming the source/drain plugs.

The first sacrificial layer 240 may be made of $SiO_x$, $SiN_x$, SiNO, $TiO_2$, or a combination thereof.

In one embodiment, the first sacrificial layer 240 and the sacrificial material film 230 may be made of $SiO_x$.

The first sacrificial layer 240 and the sacrificial material film 230 may be made of the same material. A portion of the sacrificial material film 230 may be used to form sacrificial spacers. In a subsequent process of removing the sacrificial spacers to form the cavities, a same etching process may be used to remove the first sacrificial layer 240 on the surface of the sacrificial material film 230 and remove the sacrificial material film 240 after the sacrificial material film 240 is exposed. The process steps may be reduced, and product efficiency may be improved.

As shown in FIG. 7, source/drain plugs 250 may be formed in the sacrificial material film 230, and sacrificial spacers may be formed between on the sacrificial material film 230 between the source/drain plugs 250 and the gate structures 210.

In one embodiment, the source/drain plugs 250 may be formed in the sacrificial material film 230 and the first sacrificial layer 240.

In one embodiment, bottoms of the source/drain plugs may be in contact with the source/drain doped regions 205.

The source/drain plugs 250 may be formed by: forming plug openings (not shown in the figures) in the sacrificial material film 230 and the first sacrificial layer 240 to expose the surfaces of the source/drain doped regions 204; forming a source/drain plug material film (not shown in the figures) in the plug openings and on the surface of the first sacrificial layer 240; and planarizing the source/drain plug material film until exposing the surface of the first sacrificial layer 240, to form the source/drain plugs 250 in the plug openings.

The source/drain plug material film may be formed by: forming a plug barrier material film (not shown in the figures) at bottoms and side surfaces of the plug openings and on the surface of the first sacrificial layer 240; and forming a plug conducting material film (not shown in the figures) on a surface of the plug barrier material film. The plug conducting material film may fill up the plug openings.

In one embodiment, top surfaces of the source/drain plugs 250 may be higher than the top surfaces of the gate structures 204.

The source/drain plug material film may be planarized by a chemical mechanical polishing process.

In one embodiment, after forming the plug openings and before forming the source/drain plug material film, the method may further include forming a first protection layer (not shown in the figures) on the side surface of each plug opening. The first protection layer and the sacrificial spacers may be made of different materials.

In one embodiment, the first protection layer and the sacrificial material film 230 may be made of different materials.

In one embodiment, the first protection layer and the sacrificial material film 230 may be made of different materials, and the first protection layer and the first sacrificial layer 240 may be made of different materials.

The first protection layer may be made of $SiO_x$, $SiN_x$, SiNO, $TiO_2$, or a combination thereof. In one embodiment, the first protection layer may be made of $SiN_x$.

By forming one first protection layer on the side surface of each plug opening, the first protection layer and the sacrificial spacers may be made of different materials. The first protection layers may protect the source/drain plugs 250. When removing the sacrificial spacers subsequently, the etching damage on the sidewalls of the source/drain plugs 250 may be reduced, to improve the performance of the source/drain plugs 250.

Figure 8:
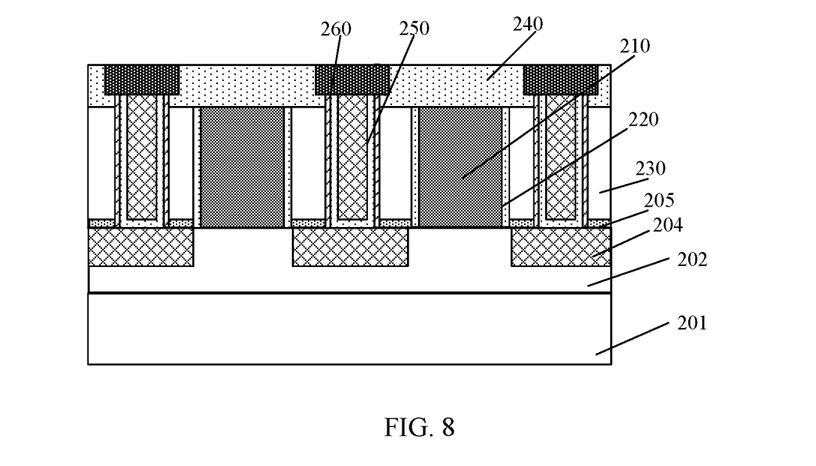

As shown in FIG. 8, after forming the source/drain plugs 250, a portion of the source/drain plugs 250 may be etched, to form barrier openings (not shown in the figures) in the first sacrificial layer 240; and then a barrier layer 260 may be formed in each barrier opening. One barrier layer 260 may be located on a top surface of a corresponding source/drain plug 250 after etching, and a width of the barrier layer 260 may be larger than a width of the corresponding source/drain plug 250.

The barrier openings may be formed by: forming a mask layer (not shown in the figures) on the surfaces of the source/drain plugs 250 and the surface of the first sacrificial layer 240, where the mask layer may expose the top surfaces of the source/drain plugs 250 and the surface of a portion of the first sacrificial layer 240 at two sides of each source/drain plugs 250; and using the mask layer as a mask to etch a portion of the source/drain plugs 250 and the first sacrificial layer 240, to form the barrier openings in the first sacrificial layer 240. The barrier openings may expose the top surfaces of the source/drain plugs 250 after etching.

The barrier layers 260 in the barrier openings may be formed by: forming a barrier material layer (not shown in the figures) in the barrier openings and on the surface of the first sacrificial layer 240; and planarizing the barrier material layer to expose the surface of the first sacrificial layer 240, to form on barrier layer 260 in each barrier opening.

The barrier layers 260 and the first sacrificial layer 240 may be made of different materials. The barrier layers 260 may be made of $SiO_x$, $SiN_x$, SiNO, $TiO_2$, or a combination thereof. In one embodiment, the barrier layers 260 may be made of $SiN_x$.

A portion of the source/drain plugs 250 may be etched, to form the barrier openings in the first sacrificial layer 240; and then one barrier layer 260 may be formed in each barrier opening. One barrier layer 260 may be located on a top surface of a corresponding source/drain plug 250 after etching, and a width of the barrier layer 260 may be larger than a width of the corresponding source/drain plug 250. The barrier layers 260 may prevent the gate structures 210 from being damaged when forming the source/drain contact openings by self alignment subsequently. Further, the barrier layers 260 with a relatively larger width may have a certain blocking and buffering effect on deposited materials. Correspondingly, the deposited materials may not easily enter cavities when forming the dielectric layer by a deposition process subsequently, which may be beneficial for the dielectric layer to make the top of the cavity enclosed, thereby improving the performance of the formed semiconductor structure.

In other embodiments, the method may not include forming the barrier layers.

After forming the gate structures 210, the source/drain plugs 250 and the sacrificial barriers, source/drain contact structures may be formed on the source/drain plugs 250 and gate contact structures may be formed on the gate structures 210, as shown in FIG. 9 to FIG. 12 (e.g., S106 in FIG. 15).

Figure 9:
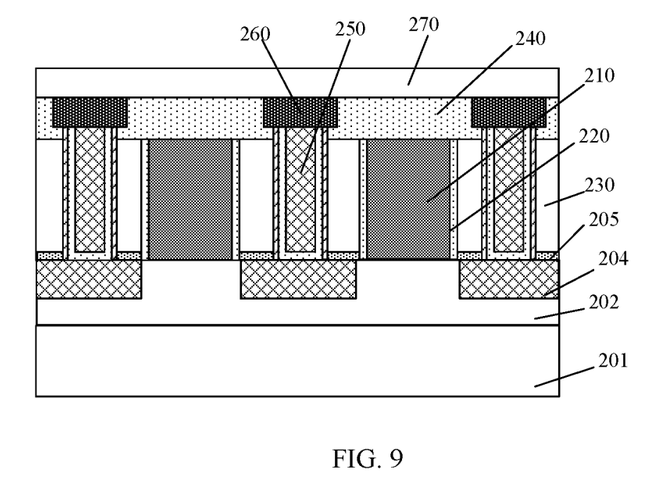

As shown in FIG. 9, a second sacrificial layer 270 may be formed on the surfaces of the source/drain plugs 250 and the surface of the first sacrificial layer 240.

The second sacrificial layer 270 may provide support for forming the source/drain contact structures and the gate contact structures.

The second sacrificial layer 270 may be made of $SiO_x$, $SiN_x$, SiNO, $TiO_2$, or a combination thereof.

In one embodiment, the second sacrificial layer 270, the first sacrificial layer 240, and the sacrificial material film 230 may be made of a same material $SiO_2$. A portion of the sacrificial material film 230 may be used to form the sacrificial barriers. Correspondingly, when removing the sacrificial barriers to form the cavities subsequently, a same etching process may be used to remove the second sacrificial layer 270 to expose the surface of the first sacrificial layer 240, then removing the first sacrificial layer 240 to expose the sacrificial material film 230, and then removing the sacrificial material film 230. The process steps may be simplified, and the production efficiency may be improved.

In one embodiment, the second sacrificial layer 270 may be formed on the surfaces of the barrier layers 260 and on the surface of the first sacrificial layer 240.

Figure 10:
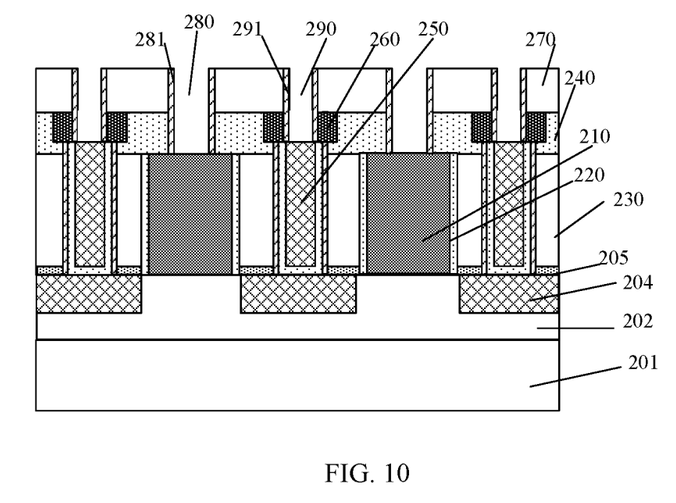

As shown in FIG. 10, gate contact openings 280 may be formed in the first sacrificial layer 240 and the second sacrificial layer 270, to expose the top surfaces of the gate structures 210.

In one embodiment, after forming the gate contact openings 280 and before forming a gate contact material film, the method may further include forming a second protection layer 281 on side surfaces of each gate contact opening 280.

Second protection layers 281 and the sacrificial spacers may be made of different materials.

By forming one second protection layer 281 on the side surfaces of each gate contact opening 280 with a material different from the sacrificial spacers, the gate contact structures formed subsequently may be protected. Correspondingly, when removing the sacrificial barriers subsequently, the etching damage on the side walls of the gate contact structures may be reduced, to improve the performance of the formed gate contact structures.

As shown in FIG. 10, source/drain contact openings 290 may be formed in the first sacrificial layer 240 and the second sacrificial layer 270, to expose the top surfaces of the source/drain plugs 250.

In one embodiment, after forming the source/drain contact openings 290 and before forming a source/drain contact material film, the method may further include forming a third protection layer 291 on side surfaces of each source/drain contact opening 290.

Third protection layers 291 and the sacrificial spacers may be made of different materials.

By forming one third protection layer 291 on the side surfaces of each source/drain contact opening 290 with a material different from the sacrificial spacers, the source/drain contact structures formed subsequently may be protected. Correspondingly, when removing the sacrificial barriers subsequently, the etching damage on the sidewalls of the source/drain contact structures may be reduced, to improve the performance of the formed source/drain contact structures.

In one embodiment, the source/drain contact openings 290 may be formed after forming the gate contact openings 280. In other embodiments, the source/drain contact openings 290 may be formed before forming the gate contact openings 280.

Figure 11:
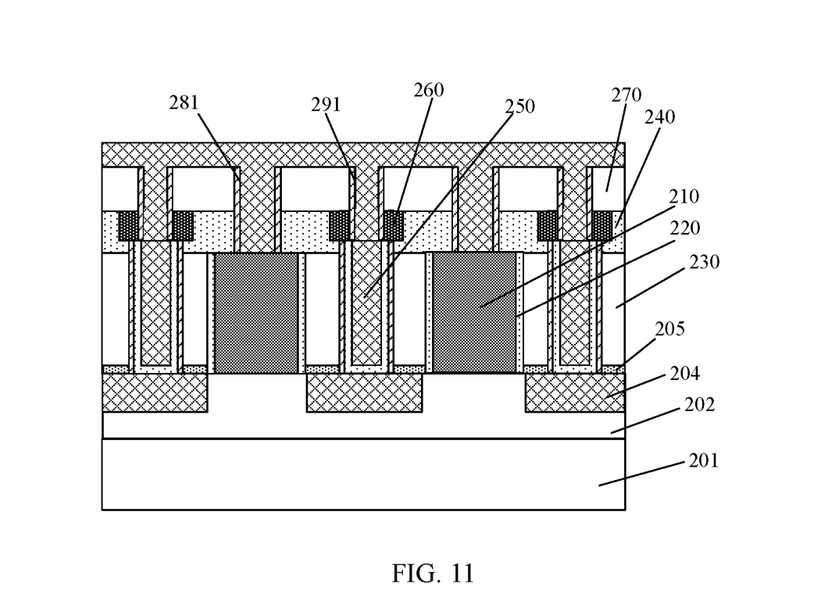

As shown in FIG. 11, a gate contact material film (305) may be formed in the gate contact openings 280 and on the surface of the second sacrificial layer 270.

The gate contact material film 305 may be used to provide a material layer for forming the gate contact structures.

The gate contact material film 305 may be formed by: forming a gate barrier material film (not shown in the figures) on bottoms and side surfaces of the gate contact openings 280 and on the surface of the second sacrificial layer 270; and forming a gate conducting material film (not labeled in the figures) on a surface of the gate barrier material film. The gate conducting material film may fill up the gate contact openings 280.

In one embodiment, the gate contact material film 305 may be located on surfaces of the second protection layers 281.

As shown in FIG. 11, a source/drain contact material film (not labeled in the figures) may be formed in the source/drain contact openings 290 and on the surface of the second sacrificial layer 270.

The source/drain contact material film may be formed by: forming a source/drain barrier material film (not shown in the figures) on bottoms and side surfaces of the source/drain contact openings 290 and on the surface of the second sacrificial layer 270; and forming a source/drain conducting material film (not labeled in the figures) on a surface of the source/drain barrier material film. The source/drain conducting material film may fill up the source/drain contact openings 290.

In one embodiment, the source/drain contact material film may be located on surfaces of the third protection layers 291.

In one embodiment, the gate contact material film and the source/drain contact material film may be formed by a same deposition process, therefore reducing the process steps and improving the production efficiency.

Figure 12:
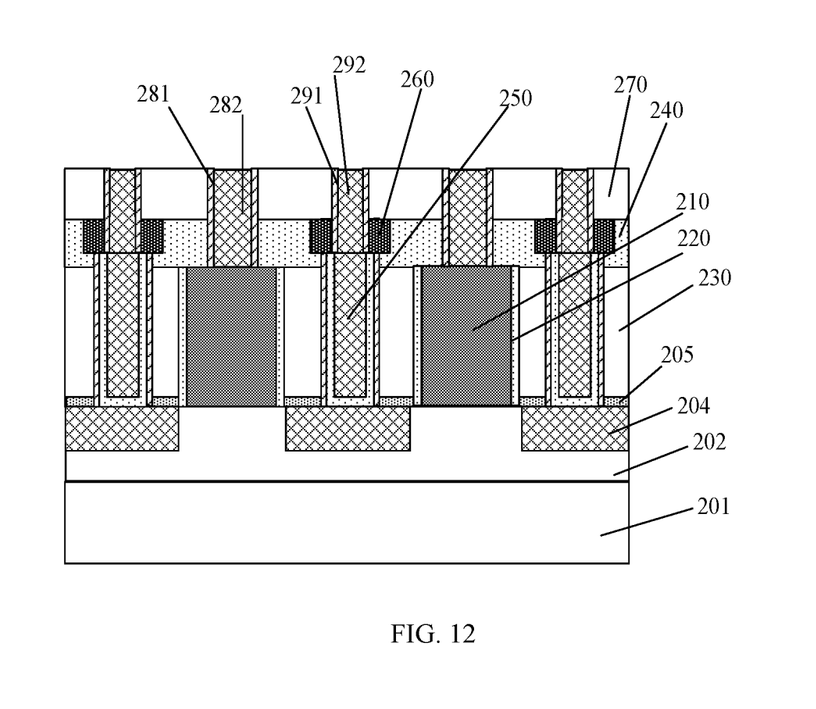

As shown in FIG. 12, the gate contact material film may be planarized until exposing the surface of the second sacrificial layer 270, to form a gate contact structure 282 in each gate contact opening 280 (as shown in FIG. 10).

As shown in FIG. 12, the source/drain contact material film may be planarized until exposing the surface of the second sacrificial layer 270, to form a source/drain contact structure 292 in each source/drain contact opening 290.

In one embodiment, each source/drain contact structure 292 may be located at the top surface of one corresponding source/drain plug 250 and may penetrate through one corresponding barrier layer 260.

In one embodiment, the gate contact material film and the source/drain contact material film may be planarized by a same planarizing process, therefore reducing the process steps and improving the production efficiency.

Figure 13:
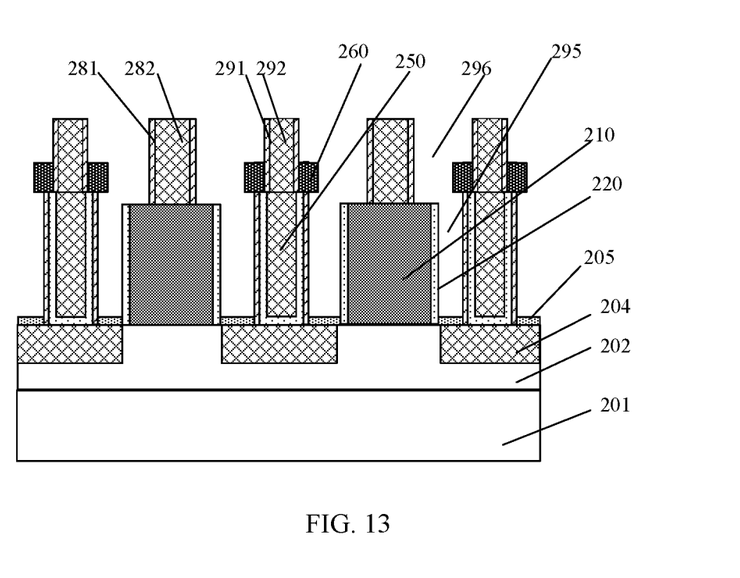

As shown in FIG. 13, after forming the source/drain contact structures 292 and the gate contact structures 282, the sacrificial spacers may be removed, to form cavities 295 between the gate structures 210 and the source/drain plugs 250 (e.g., S108 in FIG. 15).

In the present disclosure, a portion of the sacrificial material film 230 between the gate structures 210 and the source/drain plugs 250 may be used to form the sacrificial spacers. The first sacrificial layer 240, the second sacrificial layer 270, and the sacrificial material film 230 may be made of a same material. Correspondingly, when removing the sacrificial spacers, a same etching process may be used to remove the first sacrificial layer 240, the second sacrificial layer 270, and the sacrificial material film 230. The process steps may be reduced, and the production efficiency may be improved.

In one embodiment, specifically, when removing the sacrificial spacers, the first sacrificial layer 240 and the second sacrificial layer 270 may also be removed, to form dielectric openings 296 between the adjacent source/drain contact structures 292 and gate contact structures 282, or between a portion of the source/drain plugs 250 and the gate contact structures 282. Bottoms of the dielectric openings 296 may expose top surfaces of the cavities 295 and top surfaces of the gate structures 210.

Along a direction perpendicular to sidewalls of the cavities, a size of the cavities 295 may be about 5 nm to about 10 nm.

A depth of the cavities 295 may be about 10 nm to about 40 nm.

The depth of the cavities 295 may be a size of the cavities 295 along a direction perpendicular to the surface of the base substrate.

In the present disclosure, before removing the sacrificial spacers, the first sacrificial layer 240 and the second sacrificial layer 270 may be formed. After forming the first sacrificial layer 240 and the second sacrificial layer 270, the gate contact structures 282 and the source/drain contact structures 292 may be formed. Subsequently, when removing the sacrificial spacers, the first sacrificial layer 240 and the second sacrificial layer 270 may be also removed. The cavities 295 may be formed between the gate structures 210 and the source/drain plugs 250, also between a portion of the gate contact structures 282 and the source/drain plugs 250. The gate contact structures 282 may be located at the top surfaces of the gate structures 210. Each of the cavities 290 may occupy a large volume. Correspondingly, the parasitic capacitance between the gate structures 210 and the source/drain plugs 250, and between the portion of the gate contact structures 282 and the source/drain plugs 250, may be reduced effectively, to improve the performance of the semiconductor structure.

Correspondingly, by forming the gate structures 210 and the source/drain plugs 250 at the base substrate and providing the sacrificial spacers between the gate structures 210 and the source/drain plugs 250, the sacrificial spacers may be removed after forming the gate contact structures 282 and the source/drain contact structures 292, to form the cavities 295. Since the cavities 295 have an opening structure, air may fill up the cavities. Correspondingly, the cavities 295 may have a relatively small dielectric constant. The parasitic capacitance between the gate structures 210 and the source/drain plugs 250 may be reduced effectively, to improve the performance of the semiconductor structure.

Figure 14:
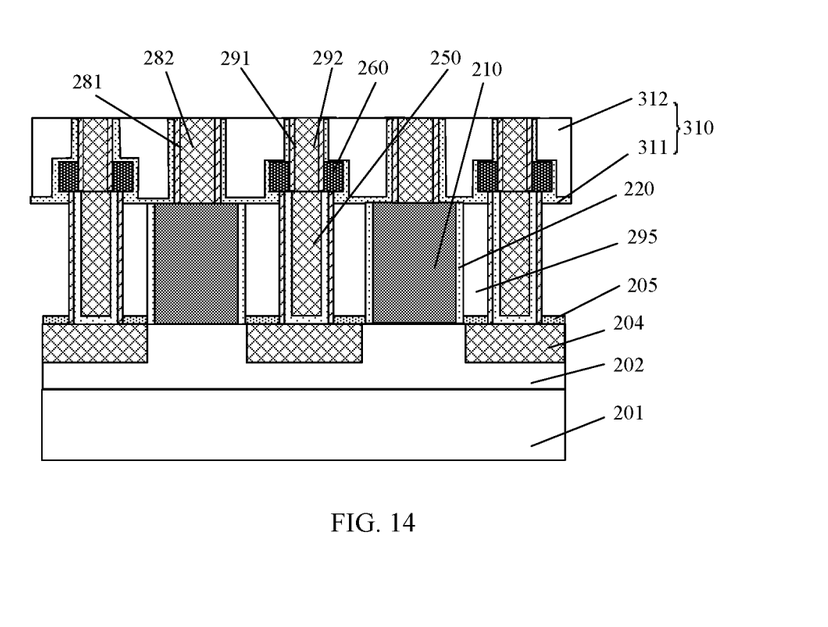

As shown in FIG. 14, a dielectric layer 310 may be formed on the gate structures 210 and the source/drain plugs 250. The dielectric layer 310 may enclose tops of the cavities 295 (e.g., S110 in FIG. 15).

The dielectric layer 310 may be formed by: forming a bottom dielectric layer 311 on the tops of the gate structures 210, a portion of the side surfaces of the source/drain plugs 250, top surfaces and side surfaces of the gate contact structures 282, and top surfaces and side surfaces of the source/drain contact structures 292, where the bottom dielectric layer 311 may enclose the tops of the cavities 295; and forming an upper dielectric layer 312 on a surface of the bottom dielectric layer 311.

The bottom dielectric layer 311 may be formed by a chemical vapor deposition process. The chemical vapor deposition process may include an ion-enhanced chemical vapor deposition process or a high-concentration plasma deposition process.

In one embodiment, the ion-enhanced chemical vapor deposition process may be used to form the bottom dielectric layer 311. The ion-enhanced chemical vapor deposition process may have a poor filling capacity, such that the film layer may be formed at the tops of the cavities 295 to enclose the tops of the cavities 295.

The present disclosure also provides a semiconductor structure. The semiconductor structure may include: a base substrate; gate structures 210 and source/drain plugs 250 on the base substrate; cavities 295 between the gate structures 210 and the source/drain plugs 250; source/drain contact structures 292 on the source/drain plugs 250; gate contact structures 282 on the gate structures 210; and a dielectric layer 310 on the gate structures 210 and the source/drain plugs 250. The dielectric layer 310 may enclose tops of the cavities 295.

In the present disclosure, the cavities 295 may be formed between the gate structures 210 and the source/drain plugs 250. Since the cavities 295 have an opening structure, air may fill up the cavities. Correspondingly, the cavities 295 may have a relatively small dielectric constant. The parasitic capacitance between the gate structures 210 and the source/drain plugs 250 may be reduced effectively, to improve the performance of the semiconductor structure.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method of a semiconductor structure, comprising:
   providing a base substrate;
   forming gate structures and source/drain plugs on the base substrate, wherein sacrificial spacers are provided between the gate structures and the source/drain plugs;
   etching a portion of the source/drain plugs, to form barrier openings in the first sacrificial layer;
   forming a barrier layer in each barrier opening, the barrier layer being located at a top surface of a corresponding etched source/drain plug, and having a width larger than a width of the corresponding etched source/drain plug;
   after forming the barrier layer, forming source/drain contact structures on the source/drain plugs, the source/drain contact structures being located at the top surfaces of the etched source/drain plugs and penetrate through barrier layers;
   forming gate contact structures on the gate structures;
   after forming the source/drain contact structures and the gate contact structures, removing the sacrificial spacers to form cavities between each gate structure and an adjacent the source/drain plug; and
   forming a dielectric layer on the gate structures and the source/drain plugs, wherein the dielectric layer encloses tops of the cavities.

2. The method according to claim 1, wherein the gate structures, the source/drain plugs, and the sacrificial spacers are formed by:
   forming the gate structures and a sacrificial material film on the base substrate, wherein the sacrificial material film covers side surfaces of the gate structures; and
   forming the source/drain plugs in the sacrificial material film, wherein a portion of the sacrificial material film between the gate structures and the source/drain plugs forms the sacrificial spacers.

3. The method according to claim 2, wherein the gate structures and the sacrificial material film are formed by:
   forming dummy gate structures on the base substrate;
   forming the sacrificial material film on the base substrate, wherein the sacrificial material film covers side surfaces of the dummy gate structures;
   removing the dummy gate structures to form dummy gate openings in the sacrificial material film; and
   forming the gate structures in the dummy gate openings.

4. The method according to claim 2, after forming the dummy gate structures and before forming the sacrificial material film, further including:
   forming spacers at side surfaces of the dummy gate structures, wherein the sacrificial material film covers side surfaces of the spacers.

5. The method according to claim 2, after forming the spacers and before forming the sacrificial material film, further including:
   forming source/drain doped regions in the base substrate at two sides of each dummy gate structure and a corresponding spacer, wherein
   the source/drain plugs are formed after forming the source/drain doped regions, and a bottom of each source/drain plug is in contact with a surface of a corresponding source/drain doped region.

6. The method according to claim 5, after forming the gate structures and the sacrificial material film, and before forming the source/drain plugs, further including:
   forming a first sacrificial layer on the surface of the sacrificial material film and the surfaces of the gate structures, wherein the source/drain plugs are formed in the sacrificial material film and the first sacrificial layer.

7. The method according to claim 6, wherein:
   the source/drain plugs are formed by:
      forming plug openings in the sacrificial material film and the first sacrificial layer to expose the surfaces of the source/drain doped regions;
      forming a source/drain plug material film in the plug openings and on a surface of the first sacrificial layer; and
      planarizing the source/drain plug material film until exposing the surface of the first sacrificial layer, to form the source/drain plugs in the plug openings, and
   after forming the plug openings and before forming the source/drain plug material film, the method further includes: forming a first protection layer on side surfaces of each of the plug openings, wherein the first protection layer and the sacrificial spacers are made of different materials.

8. The method according to claim 6, wherein the source/drain plug material film may be formed by:
   forming a plug barrier material film on bottoms and side surfaces of the plug openings and on the surface of the first sacrificial layer; and
   forming a plug conduction material film on a surface of the plug barrier material film, wherein the plug conduction material film fills up the plug openings.

9. The method according to claim 5, after forming the gate structures and the source/drain plugs, and before forming the gate contact structures and the source/drain contact structures, further including:
   forming a second sacrificial layer on the surfaces of the source/drain plugs and the surface of the first sacrificial layer, wherein the gate contact structures and the source/drain contact structures are formed in the first sacrificial layer and the second sacrificial layer.

10. The method according to claim 9, wherein the gate contact structures are formed by:
    forming gate contact openings in the first sacrificial layer and the second sacrificial layer, to expose the top surfaces of the gate structures;
    forming a gate contact material film in the gate contact openings and on a surface of the second sacrificial layer; and
    planarizing the gate contact material film to expose the surface of the second sacrificial layer, to form a gate contact structure in each gate contact opening.

11. The method according to claim 10, after forming the gate contact openings and before forming the gate contact material film, further including:
    forming a second protection layer on side surfaces of each gate contact opening, wherein the second protection layer and the sacrificial spacers are made of different materials, wherein:
       the gate contact material film is formed by:
          forming a gate barrier material film on bottoms and side surfaces of the gate contact openings and on the surface of the second sacrificial layer; and
          forming a gate conducting material film on a surface of the gate barrier material film, wherein the gate conducting material film fills up the gate contact openings.

12. The method according to claim 9, wherein the source/drain contact structures are formed by:
    forming source/drain contact openings in the first sacrificial layer and the second sacrificial layer, to expose top surfaces of the source/drain plugs;
    forming a source/drain contact material film in the source/drain contact openings and on a surface of the second sacrificial layer; and
    planarizing the source/drain contact material film to expose the surface of the second sacrificial layer, to form a source/drain contact structure in each source/drain contact opening.

13. The method according to claim 12, after forming the source/drain contact openings and before forming the source/drain contact material film, further including:
    forming a third protection layer on side surfaces of each of the source/drain contact openings, wherein the third protection layer and the sacrificial spacers are made of different materials,
    wherein:
       the source/drain contact material film is formed by:
          forming a source/drain barrier material film on bottoms and side surfaces of the source/drain contact openings and on the surface of the second sacrificial layer; and
          forming a source/drain conducting material film on a surface of the source/drain barrier material film, wherein the source/drain conducting material film fills up the source/drain contact openings.

14. The method according to claim 1, wherein the barrier openings are formed by:
    forming a mask layer on the surfaces of the source/drain plugs and the surface of the first sacrificial layer, wherein the mask layer exposes the top surfaces of the source/drain plugs and the surface of a portion of the first sacrificial layer at two sides of each source/drain plugs; and
    using the mask layer as a mask to etch a portion of the source/drain plugs and the first sacrificial layer, to form the barrier openings in the first sacrificial layer, wherein the barrier openings expose the top surfaces of the etched source/drain plugs.

15. The method according to claim 14, wherein the barrier layers in the barrier openings are formed by:
    forming a barrier material layer in the barrier openings and on the surface of the first sacrificial layer; and
    planarizing the barrier material layer to expose the surface of the first sacrificial layer, to form one barrier layer in each barrier opening.

16. The method according to claim 1, wherein the dielectric layer is formed by:
    forming a bottom dielectric layer on the tops of the gate structures, a portion of the side surfaces of the source/drain plugs, top surfaces and side surfaces of the gate contact structures, and top surfaces and side surfaces of the source/drain contact structures, wherein the bottom dielectric layer encloses the tops of the cavities; and
    forming an upper dielectric layer on a surface of the bottom dielectric layer,
    wherein:
       the bottom dielectric layer is formed by a chemical vapor deposition process including an ion-enhanced chemical vapor deposition process or a high-concentration plasma deposition process.

\* \* \* \* \*